(12) United States Patent
Roh

(10) Patent No.: US 10,019,173 B1
(45) Date of Patent: Jul. 10, 2018

(54) MEMORY SYSTEM AND OPERATING METHOD THEREOF

(71) Applicant: SK hynix Inc., Gyeonggi-do (KR)

(72) Inventor: Young-Dong Roh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/794,105

(22) Filed: Oct. 26, 2017

(30) Foreign Application Priority Data

Mar. 6, 2017 (KR) .......................... 10-2017-0028278

(51) Int. Cl.
*G11C 16/04* (2006.01)
*G06F 3/06* (2006.01)
*G06F 12/02* (2006.01)

(52) U.S. Cl.
CPC ............ *G06F 3/061* (2013.01); *G06F 3/0625* (2013.01); *G06F 3/0634* (2013.01); *G06F 3/0646* (2013.01); *G06F 3/0679* (2013.01); *G06F 12/0246* (2013.01); *G06F 2212/7201* (2013.01)

(58) Field of Classification Search
CPC ...... G06F 3/061; G06F 3/0625; G06F 3/0634; G06F 3/0646; G06F 3/0679; G06F 12/0246; G06F 2212/7201
See application file for complete search history.

(56) References Cited

U.S. PATENT DOCUMENTS

| | | | |
|---|---|---|---|
| 8,578,208 B2* | 11/2013 | Gyllenskog | G06F 11/1044 714/6.13 |
| 9,229,805 B2* | 1/2016 | Yim | G06F 12/0246 |
| 9,760,308 B2* | 9/2017 | Kang | G06F 3/0652 |
| 2018/0121097 A1 | 5/2018 | Kim | |

* cited by examiner

*Primary Examiner* — Pho M Luu
(74) *Attorney, Agent, or Firm* — IP & T Group LLP

(57) ABSTRACT

A memory system includes a memory device comprising a plurality of memory blocks each memory block having N word line groups, N being a natural number equal to or more than 2; and a controller suitable for: selecting bad memory blocks among the memory blocks; arranging normal word line groups of the selected bad memory blocks into one or more memory-block-word-line groups each including non-conflicting N normal word line groups; and managing each of the memory-block-word-line groups as a reused memory block, the controller manages a reused block mapping table including a plurality of entries respectively corresponding to the memory-block-word-line groups, the reused block mapping table includes a plurality of logical addresses respectively corresponding to the entries, and each of the entries includes a plurality of physical address values respectively corresponding to the selected bad memory blocks having the normal word line groups included in the corresponding memory-block-word-line group.

20 Claims, 13 Drawing Sheets

MEMORY SYSTEM AND OPERATING METHOD THEREOF

CROSS-REFERENCE TO RELATED APPLICATION

The present application claims priority of Korean Patent Application No. 10-2017-0028278, filed on Mar. 6, 2017, which is incorporated herein by reference in its entirety.

BACKGROUND

1. Field

Various embodiments relate to a memory system, and more particularly, to a memory system which processes data to and from a memory device and an operating method thereof.

2. Description of the Related Art

The computer environment paradigm has changed to ubiquitous computing systems that can be used anytime and anywhere. Due to this, use of portable electronic devices such as mobile phones, digital cameras, and notebook computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption since they have no moving parts. Examples of memory systems having such advantages include universal serial bus (USB) memory devices, memory cards having various interfaces, and solid state drives (SSD).

SUMMARY

Various embodiments are directed to a memory system capable of reusing a bad memory block, and an operating method thereof.

In an embodiment, a memory system may include: a memory device comprising a plurality of memory blocks each memory block having N word line groups, N being a natural number equal to or more than 2; and controller suitable for: selecting bad memory blocks among the memory blocks; arranging normal word line groups of the selected bad memory blocks into one or more memory-block-word-line groups each including non-conflicting N normal word line groups; and managing each of the memory-block-word-line groups as a reused memory block, the controller may manage a reused block mapping table including a plurality of entries respectively corresponding to the memory-block-word-line groups, the reused block mapping table may further include a plurality of logical addresses respectively corresponding to the entries, and each of the entries may include a plurality of physical address values respectively corresponding to the selected bad memory blocks having the normal word line groups included in the corresponding memory-block-word-line group.

The controller may manage a normal mapping table for mapping the physical addresses of the memory blocks to normal logical addresses, and the values of the normal logical addresses may do not overlap the values of the logical addresses corresponding to the entries.

Physical arrangement orders of the word line groups in each of the memory blocks may be predetermined in the memory block, and the physical arrangement orders of the normal word line groups in each of the memory-block-word-line groups may do not overlap each other but are set to consecutive orders.

The controller may sort the arrangement sequence of the physical addresses included in each entry stored in the reused block mapping table such that the N normal word line groups included in the corresponding memory-block-word-line group do not conflict with each other.

The controller may further manage the plurality of memory blocks as a plurality of super memory blocks each including two or more among the plurality of memory blocks, and the controller may further generate a reused super memory block by grouping normal memory blocks of two or more bad super memory blocks including one or more bad memory blocks among the plurality of super memory blocks.

The controller may generate the reused super memory block further by replacing a bad memory block included in the two or more bad super memory blocks with the reused memory block.

The memory device may further include: a plurality of planes corresponding to a plurality of ways which share one channel to input/output data in an interleaving manner, respectively, and each comprising the memory blocks; and a plurality of memory dies corresponding to a plurality of channels for inputting/outputting data in an interleaving manner, respectively, and each comprising the planes.

The controller may further group an arbitrary memory block included in a first plane of any one memory die among the memory dies and an arbitrary memory block included in a second plane.

The controller may further group an arbitrary memory block included in a first plane of a first memory die among the memory dies and an arbitrary memory block included in a first plane of a second memory die; or may group an arbitrary memory block included in a second plane of the first memory die and an arbitrary memory block included in a second plane of the second memory die.

The controller may group an arbitrary memory block included in a first plane of a first memory die among the memory dies, an arbitrary memory block included in a second plane of the first memory die, an arbitrary memory block included in a first plane of a second memory die, and an arbitrary memory block included in a second plane of the second memory die.

In an embodiment, an operating method of a memory system which includes a memory device having a plurality of memory blocks each having N word line groups, N being a natural number, the operating method may include: selecting bad memory blocks among the memory blocks, arranging normal word line groups of the selected bad memory blocks into one or more memory-block-word-line groups each including non-conflicting N normal word line groups, and managing each of the memory-block-word-line groups as a reused memory block, the grouping of the normal word lines may include managing a reused block mapping table including a plurality of entries respectively corresponding to the memory-block-word-line groups, the reused block mapping table may further include a plurality of logical addresses respectively corresponding to the entries, and each of the entries may include a plurality of physical address values respectively corresponding to the selected bad memory blocks having the normal word line groups included in the corresponding memory-block-word-line group.

The operating method may further include managing a normal mapping table for mapping the physical addresses of the memory blocks to normal logical addresses, the values of the normal logical addresses managed in the managing of the normal mapping table may do not overlap the values of the logical addresses corresponding to the entries.

Physical arrangement orders of the word line groups in each of the memory blocks may be predetermined in the memory block, and the physical arrangement orders of the normal word line groups in each of the memory-block-word-line groups may do not overlap each other but are set to consecutive orders.

The grouping of the normal word lines may include sorting the arrangement sequence of the physical addresses included in each entry stored in the reused block mapping table such that the N normal word line groups included in the corresponding memory-block-word-line group do not conflict with each other.

The operating method may further include: managing the plurality of memory blocks as a plurality of super memory blocks each including two or more among the plurality of memory blocks, and generating a reused super memory block by grouping normal memory blocks of two or more bad super memory blocks including one or more bad memory blocks among the plurality of super memory blocks.

The generating of the reused super memory block may further include replacing a bad memory block included in the two or more bad super memory blocks with the reused memory block.

The memory device may further include: a plurality of planes corresponding to a plurality of ways which share one channel to input/output data in an interleaving manner, respectively, and each comprising the memory blocks; and a plurality of memory dies corresponding to a plurality of channels for inputting/outputting data in an interleaving manner, respectively, and each comprising the planes.

The operating method may further include grouping an arbitrary memory block included in a first plane of any one memory die among the memory dies and an arbitrary memory block included in a second plane.

The operating method may further include: grouping an arbitrary memory block included in a first plane of a first memory die among the memory dies and an arbitrary memory block included in a first plane of a second memory die; or grouping an arbitrary memory block included in a second plane of the first memory die and an arbitrary memory block included in a second plane of the second memory die.

The operating method may further include grouping an arbitrary memory block included in a first plane of a first memory die among the memory dies, an arbitrary memory block included in a second plane of the first memory die, an arbitrary memory block included in a first plane of a second memory die, and an arbitrary memory block included in a second plane of the second memory die.

DETAILED DESCRIPTION

Figure 1:
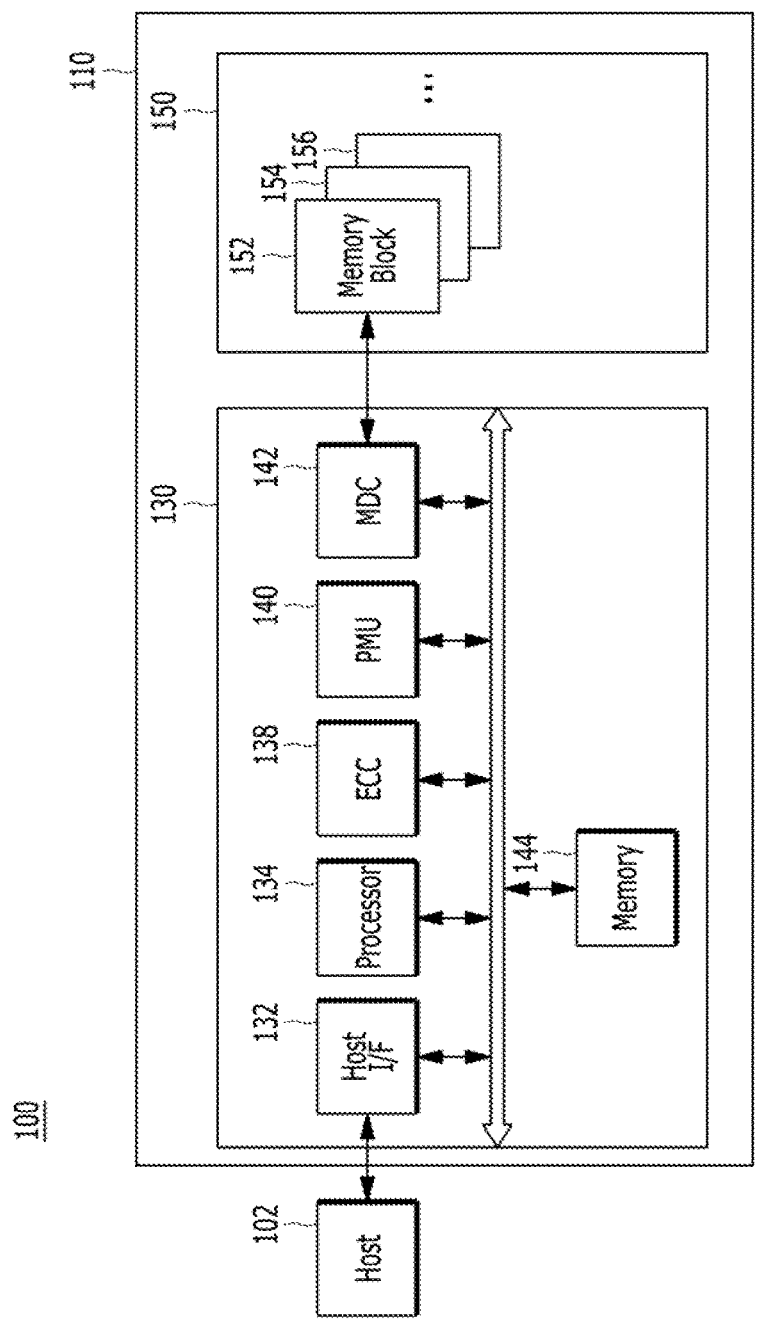
FIG. 1 is a block diagram illustrating a data processing system including a memory system in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate various features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 including a memory system 110 in accordance with an embodiment of the present invention.

Referring to FIG. 1, the data processing system 100 may include a host 102 operatively coupled to the memory system 110.

The host 102 may include portable electronic devices such as a mobile phone, MP3 player and laptop computer or non-portable electronic devices such as a desktop computer, game machine, TV and projector.

The host 102 may include at least one OS (operating system), and the OS may manage and control the functions and operations of the host 102, and provide an operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile.

The memory system 110 may operate to store data for the host 102 in response to a request of the host 102. Non-limited examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC. The SD card may include a mini-SD card and micro-SD card.

The memory system 110 may be embodied by various types of storage devices. Non-limited examples of storage devices included in the memory system 110 may include volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensional (3D) stack structure.

The memory system 110 may include a memory device 150 and a controller 130. The memory device 150 may store data for the host 120, and the controller 130 may control data storage into the memory device 150.

The controller 130 and the memory device 150 may be integrated into a single semiconductor device, which may be included in the various types of memory systems as exemplified above.

Non-limited application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory dies (not shown), each memory die including a plurality of planes (not shown), each plane including a plurality of memory blocks 152 to 156, each of the memory blocks 152 to 156 may include a plurality of pages, and each of the pages may include a plurality of memory cells coupled to a word line.

In an embodiment, the memory device 150 may be a flash memory, and particularly, a flash memory having a 3-dimensional (3D) stack structure.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) unit 132, a processor 134, an error correction code (ECC) unit 138, a Power Management Unit (PMU) 140, a memory device controller (MDC) 142 and a memory 144 all operatively coupled via an internal bus.

The host interface unit 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fall signal.

The ECC unit 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices for error correction.

The PMU 140 may provide and manage power of the controller 130.

The MDC 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the MDC 142 may be a NAND flash controller and may generate a control signal for the memory device 150 and process data to be provided to the memory device 150 under the control of the processor 134. The MDC 142 may work as an interface (e.g., a NAND flash interface) for processing a command and data between the controller 130 and the memory device 150. Specifically, the MDC 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

Figure 2:
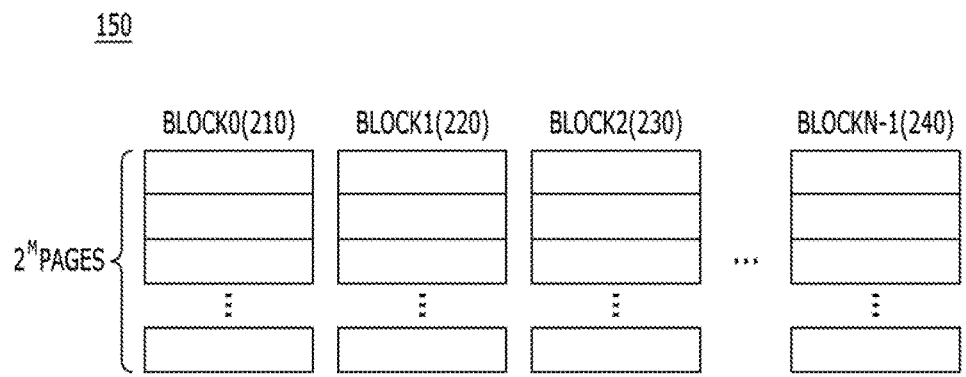
FIG. 2 is a schematic diagram illustrating an exemplary configuration of a memory device employed in the memory system shown in FIG. 1.

FIG. 2 is a schematic diagram illustrating the memory device 150.

Referring to FIG. 2, the memory device 150 may include a plurality of memory blocks 0 to N−1, and each of the blocks 0 to N−1 may include a plurality of pages, for example, $2^M$ pages, the number of which may vary according to circuit design. Memory cells included in the respective memory blocks 0 to N−1 may be one or more of a single level cell (SLC) storing 1-bit data, a multi-level cell (MLC) storing 2-bit data, a triple level cell (TLC) storing 3-bit data, a quadruple level cell (QLC) storing 4-bit level cell, a multiple level cell storing 5-or-more-bit data, and so forth.

Figure 3:
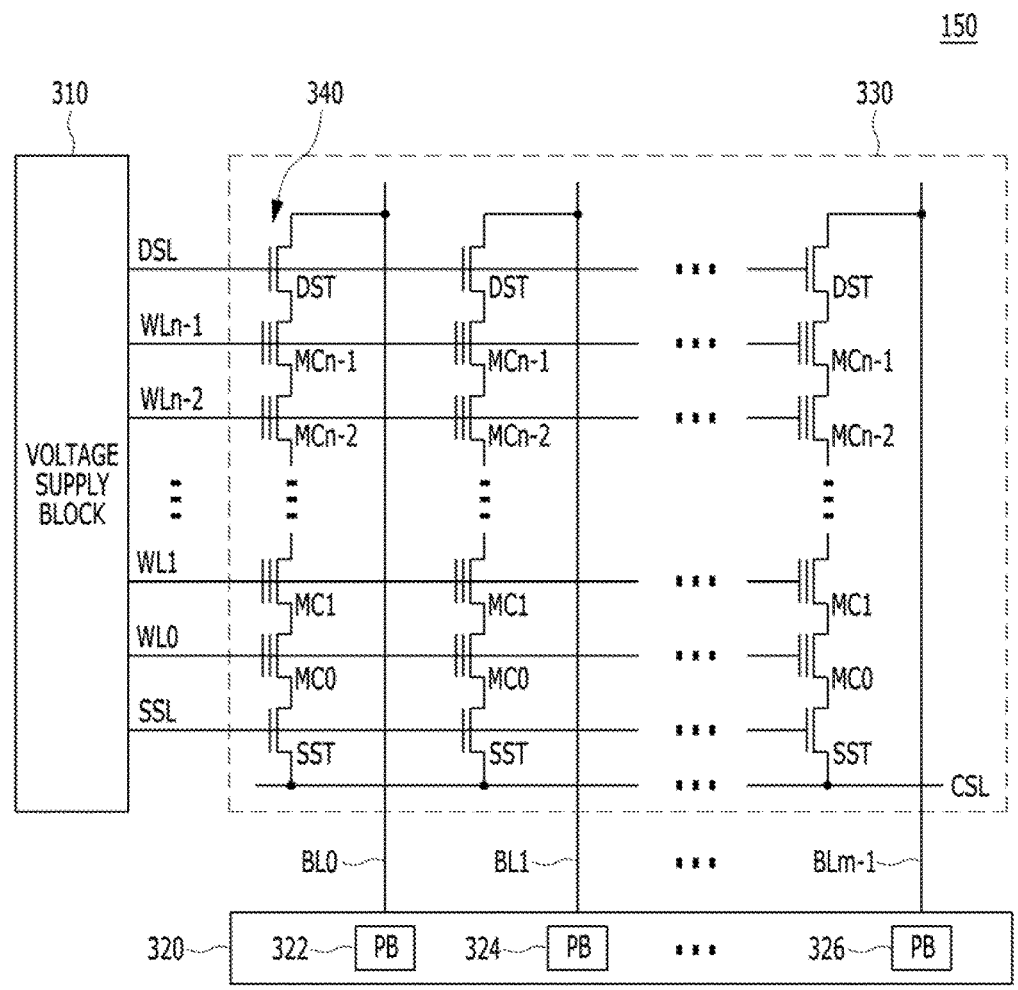
FIG. 3 is a circuit diagram illustrating an exemplary configuration of a memory cell array of a memory block in the memory device shown in FIG. 2.

FIG. 3 is a circuit diagram illustrating an exemplary configuration of a memory cell array of a memory block in the memory device 150.

Referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm−1. The cell string 340 of each column may include one or more drain select transistors DST and one or more source select transistors SST. Between the drain and select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited in this way. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
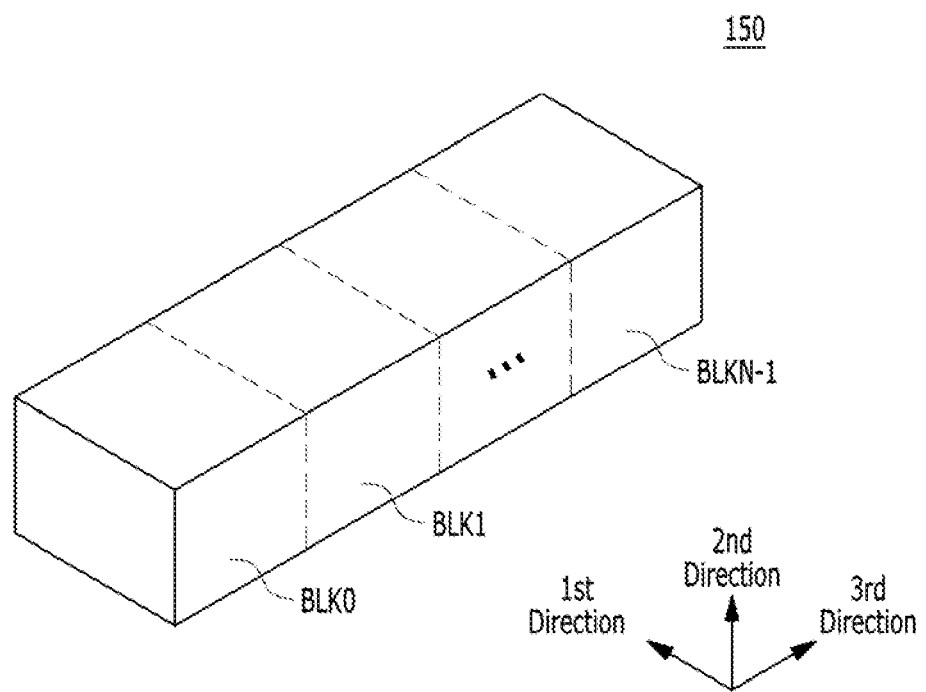
FIG. 4 is a schematic diagram illustrating an exemplary three-dimensional structure of the memory device shown in FIG. 2.

FIG. 4 is a schematic diagram illustrating an exemplary 3D structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1 each having a 3D structure (or vertical structure).

Figure 5:
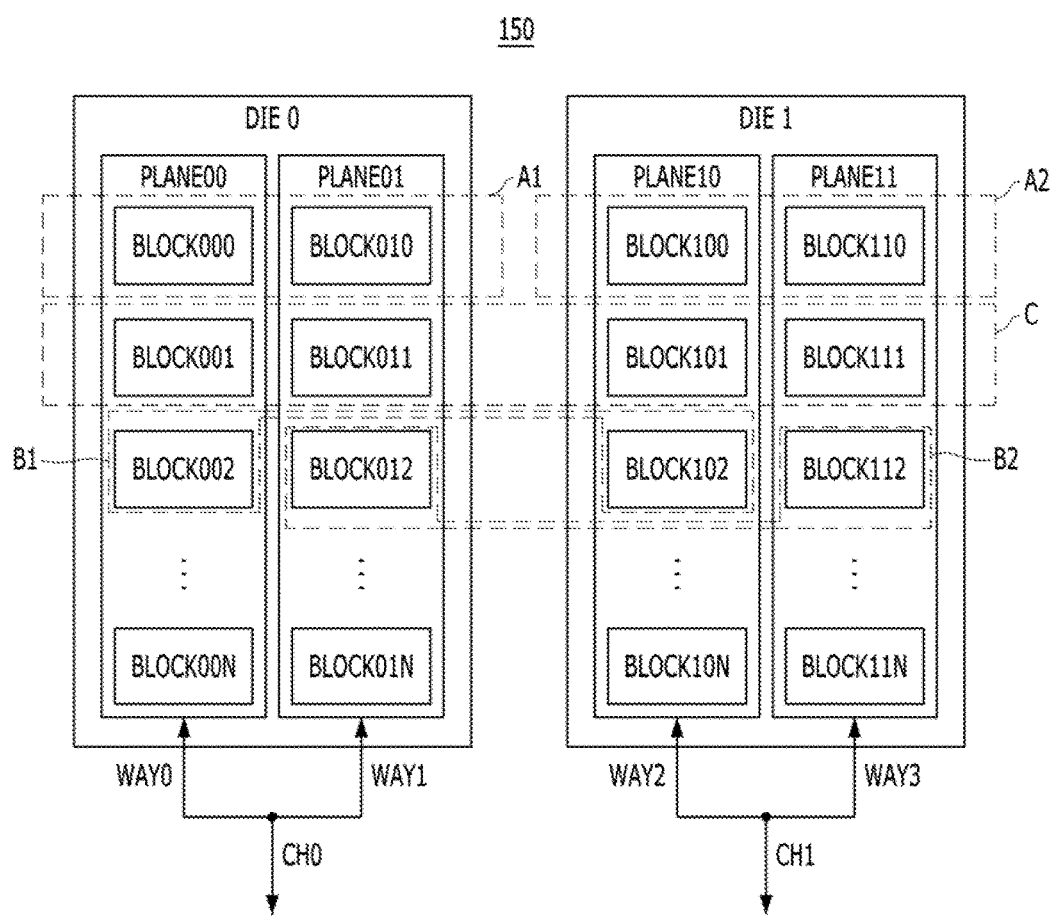
FIG. 5 is a diagram illustrating an exemplary configuration of a super memory block used in a memory system in accordance with an embodiment of the present invention.

FIG. 5 is a diagram illustrating an exemplary configuration of a super memory block used in a memory system in accordance with an embodiment of the present invention.

Referring to FIG. 5, the memory device 150 includes a plurality of memory blocks BLOCK 000 to BLOCK 11N The memory device 150 may include a plurality of dies, for example, a zeroth memory die DIE0 capable of inputting/outputting data through a zeroth channel CH0 and a first memory die DIE1 capable of inputting/outputting data through a first channel CH1. The zeroth channel CH0 and the first channel CH1 may input/output data in an interleaving scheme.

The zeroth memory die DIE0 may include a plurality of planes, for example, PLANE00 and PLANE01 capable of inputting/outputting data in the interleaving scheme by sharing the zeroth channel CH0, via corresponding zeroth and first ways WAY0 and WAY1.

The first memory die DIE1 may include a plurality of planes, for example, PLANE10 and PLANE11 capable of inputting/outputting data in the interleaving scheme by sharing the first channel CH1 via corresponding second and third WAY2 and WAY3.

The first plane PLANE00 of the zeroth memory die DIE0 may include a plurality of memory blocks BLOCK 000 to BLOCK 00N among the plurality of memory blocks BLOCK 000 to BLOCK 11N.

The second plane PLANE01 of the zeroth memory die DIE0 may include a plurality of memory blocks BLOCK 010 to BLOCK 01N among the plurality of memory blocks BLOCK 000 to BLOCK 11N.

The first plane PLANE10 of the first memory die DIE1 may include a plurality of memory blocks BLOCK 100 to BLOCK 10N among the plurality of memory blocks BLOCK 000 to BLOCK 11N.

The second plane PLANE11 of the first memory die DIE1 may include a predetermined number of memory blocks BLOCK 110 to BLOCK 11N among the plurality of memory blocks BLOCK 000 to BLOCK 11N.

Hence, the plurality of memory blocks BLOCK 000 to BLOCK 11N included in the memory device 150 may be divided into groups, according to their physical locations and their use of the ways and channels.

We note that FIG. 5 illustrates an example where two memory dies DIE0 and DIE1 are included in the memory device 150, two planes are included in each of the dies DIE0 and DIE1 and the same predetermined number of memory blocks are included in each of the planes. It is noted, that according to a designer's choice, the number of memory dies may be greater or smaller than two may be included in the memory device 150, and a number of planes that is larger or smaller than two may be included in each memory die. Also, the number of memory blocks included in each plane may be adjusted variously according to a designer's choice.

The controller 130 may manage the plurality of memory blocks of the memory device 150 by grouping at least some of the memory blocks into one or more super memory blocks. The controller may select the memory blocks of each superblock simultaneously.

In the respective super memory blocks, memory blocks may be simultaneously selected through an interleaving scheme, for example, a channel interleaving scheme, a memory die interleaving scheme, a memory chip interleaving scheme or a way interleaving scheme.

Figure 6:
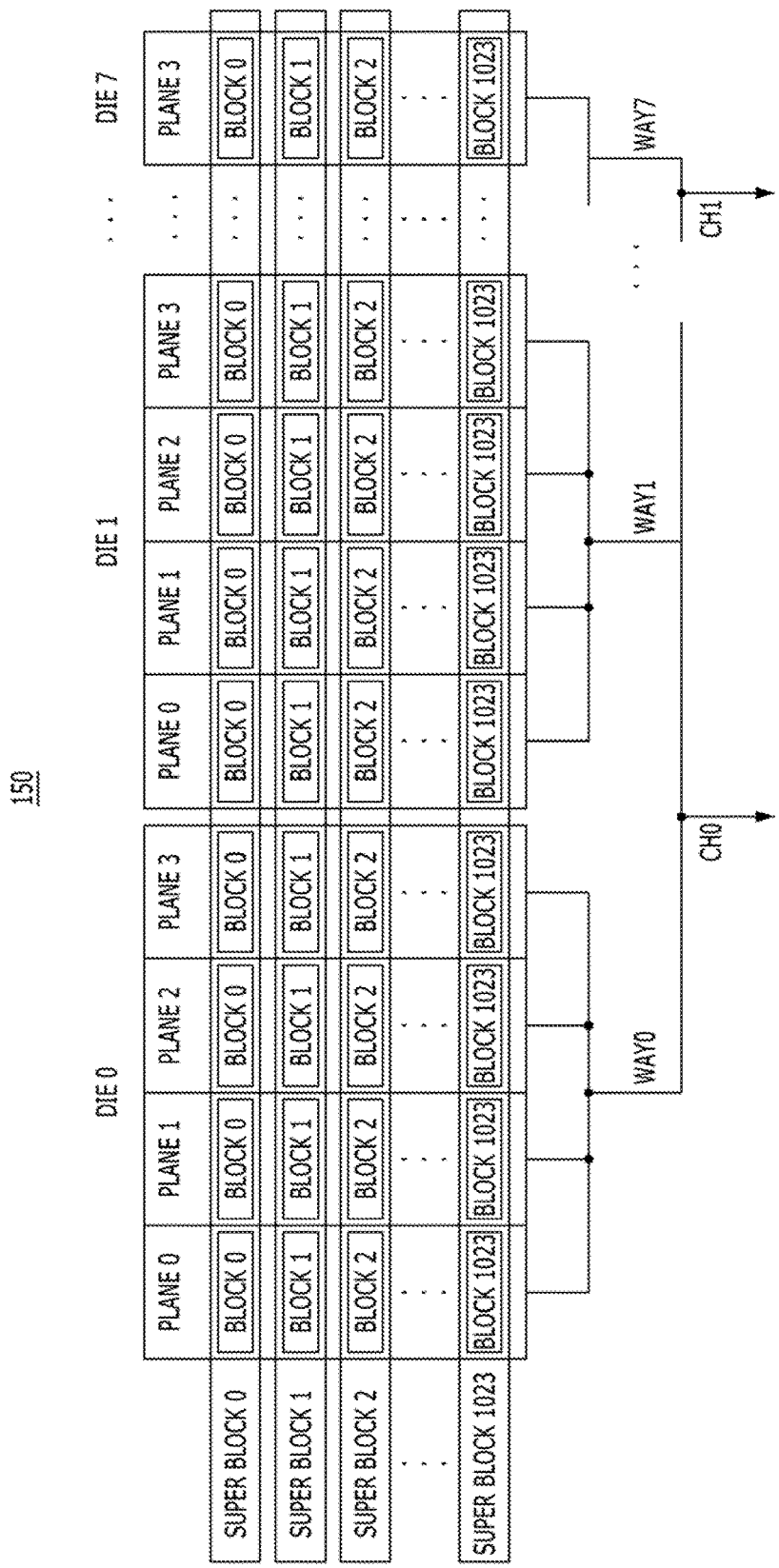
FIG. 6 is a diagram illustrating an exemplary operation of managing memory blocks in units of super memory blocks in the memory system in accordance with an embodiment of the present invention.

FIG. 6 is a diagram illustrating an operation of managing memory blocks in units of super memory blocks in the memory system in accordance with an embodiment of the present invention.

Referring to FIG. 6, a scheme of selecting each of super memory blocks may be seen.

First, it is exemplified that the memory device 150 includes eight memory dies DIE<0:7>, each of the eight memory dies DIE<0:7> includes four planes PLANE<0:3> to allow the eight memory dies DIE<0:7> to include total 32 planes PLANE<0:3>*8, and each of the 32 planes PLANE<0:3>*8 includes 1,024 memory blocks BLOCK<0:1023>. In other words, it is exemplified that the memory device 150 includes total 32,768 memory blocks BLOCK<0:1023>*32.

Also, it is exemplified that, in the memory device 150, the total 32 planes PLANE<0:3>*8 included in the eight memory dies DIE<0:7> input/output data through two channels CH<0:1> and eight ways WAY<0:7>. Namely, it is exemplified that, in the memory device 150, four planes PLANE<0:3> of the respective 8 dies DIE<0:7> share one of 8 ways WAY<0:7>. Also, a first half of the 8 ways WAY<0:7> (e.g., first four ways WAY<0:3>) share a first channel CH0 and a second half of the 8 ways WAY<0:7> (e.g., last four ways WAY<4:7>) share a second channel CH1.

The controller 130 of the memory system 110 in accordance with an embodiment of the present invention uses a scheme of managing the plurality of memory blocks included in the memory device 150, by dividing them in units of super memory blocks.

As exemplified in FIG. 6, the controller 130 manages each of the super memory blocks SUPER BLOCK<0:1023> to have 32 memory blocks by selecting one arbitrary memory block from each of the 32 planes PLANE<0:3>*8 included in the memory device 150. Therefore, 32 memory blocks are included in each of the super memory blocks SUPER BLOCK<0:1023>.

Since the controller 130 selects simultaneously the 32 memory blocks included in each of the super memory blocks SUPER BLOCK<0:1023>, in a configuration in which management is performed in units of super memory blocks as in FIG. 6, only super memory block addresses are used for selecting the respective super memory blocks SUPER BLOCK<0:1023>.

In an embodiment, a configuration is provided in which management is performed in units of super memory blocks, instead of using memory block addresses (not shown) for selecting the respective 32,768 memory blocks BLOCK<0:1023>*32 included in the memory device 150, hence, only super memory block addresses (not shown) can be used for selecting the respective 1,024 super memory blocks SUPER BLOCK<0:1023>.

For using only the super memory block addresses, the controller 130 forms each super memory block by grouping memory blocks of the same location from the respective 32 planes PLANE<0:3>*8 Included in the memory device 150.

For example, the controller 130 forms a zeroth super memory block SUPER BLOCK 0 by grouping 32 zeroth memory blocks BLOCK 0 from the respective 32 planes PLANE<0:3>*8 included in the memory device 150, forms a first super memory block SUPER BLOCK 1 by grouping 32 first memory blocks BLOCK 1 in the respective 32 planes PLANE<0:3>*8, and forms a second super memory block SUPER BLOCK 2 by grouping 32 second memory blocks BLOCK 2 in the respective 32 planes PLANE<0:3>*8. In this manner, the controller 130 manages the 32,768 memory blocks BLOCK<0:1023>*32 included in the memory device 150, by dividing them into the total 1,024 super memory blocks SUPER BLOCK<0:1023>.

Generally, it is substantially impossible for all the memory blocks included in the memory device 150, to operate normally. Typically, about 2% of the memory blocks of a memory device may be bad memory blocks which do not operate normally. For example, it may be that in the embodiment of FIG. 6, where it is illustrated that 32,768 memory blocks BLOCK<0:1023>*32 are included in the memory device 150, about 650 memory blocks corresponding to approximately 2% may be bad memory blocks.

In this regard, as described above, in the case where the controller 130 uses the scheme of managing super memory blocks by grouping memory blocks of the same locations in the respective 32 planes PLANE<0:3>*8 included in the memory device 150 in order to use only super memory block addresses, a bad super memory block, in which a bad memory block is included among the super memory blocks SUPER BLOCK<0:1023>, may not operate normally. That is to say, if even one memory block among the 32 memory blocks included in each of the super memory blocks SUPER BLOCK<0:1023> is determined as a bad memory block, a corresponding bad super memory block may not operate normally.

In this manner, even though only one memory block is a bad memory block and all the remaining 31 memory blocks are normal among the 32 memory blocks included in any one super memory block, the corresponding bad super memory block is not used, which is markedly inefficient.

In consideration of this fact, in the memory system 110 in accordance with an embodiment of the present invention, a bad super memory block where at least one bad memory block is included is reused by employing a reused super block table.

Figure 7:
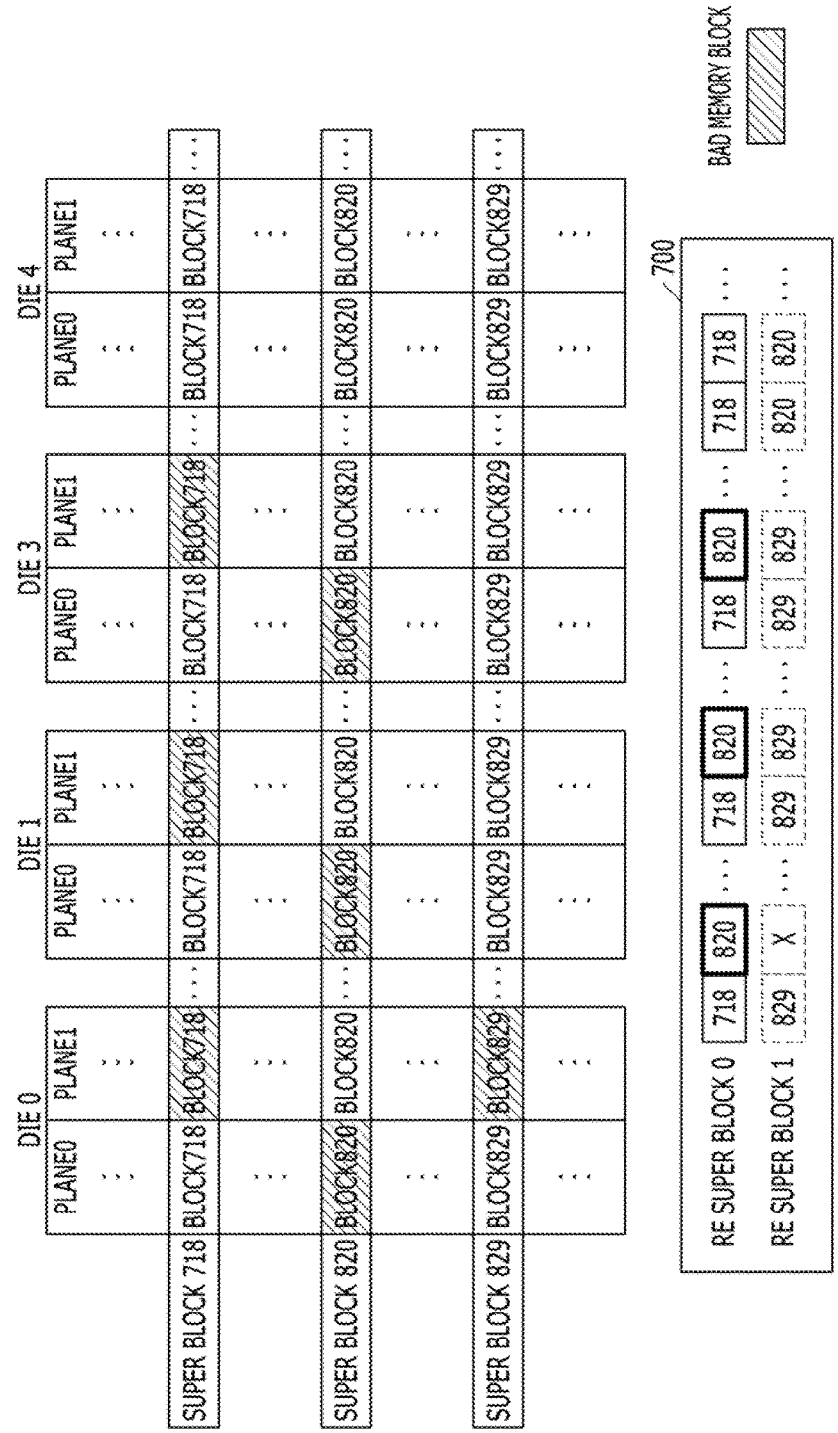
FIG. 7 is a diagram illustrating an exemplary method for reusing a bad super memory block in a memory system in accordance with an embodiment of the present invention.

FIG. 7 is a diagram illustrating a method for reusing a bad super memory block in a memory system in accordance with an embodiment.

FIG. 7 exemplifies some bad memory blocks in the 32 memory blocks of each of the 718th super memory block SUPER BLOCK 718, the 820th super memory block SUPER BLOCK 820 and the 829th super memory block SUPER BLOCK 829 among the plurality of super memory blocks SUPER BLOCK<0:1203> included in the memory device 150 illustrated in FIG. 6.

As exemplified in FIG. 7, among the 32 memory blocks included in the 718th super memory block SUPER BLOCK 718, a total of three memory blocks included in the first plane PLANE1 of the zeroth memory die DIE0, the first plane PLANE1 of the first memory die DIE1 and the first plane PLANE1 of the third memory die DIE3 are determined as bad memory blocks.

Also, as exemplified in FIG. 7, among the 32 memory blocks included in the 820th super memory block SUPER BLOCK 820 among the plurality of super memory blocks SUPER BLOCK<0:1203>, a total of three memory blocks included in the zeroth plane PLANE0 of the zeroth memory die DIE0, the zeroth plane PLANE0 of the first memory die DIE1 and the zeroth plane PLANE0 of the third memory die DIE3 are determined as bad memory blocks.

Also, as exemplified in FIG. 7, among the 32 memory blocks included in the 829th super memory block SUPER BLOCK 829 among the plurality of super memory blocks SUPER BLOCK<0:1203>, one memory block included in the first plane PLANE1 of the zeroth memory die DIE0 are determined as a bad memory block.

In accordance with an embodiment of the present invention, in the above-described situation, the controller 130 may generate a reused super block table 700 for reusing bad super memory blocks as normal super memory blocks by replacing bad memory blocks, which are included in the bad super memory blocks, with normal memory blocks, which are also included in the bad super memory blocks.

For example, in order to reuse the bad 718th super memory block SUPER BLOCK 718, the controller 130 may search for another bad super memory block which has normal memory blocks for replacing the bad memory blocks of the bad 718th super memory block SUPER BLOCK 718.

As a result of the search for another bad super memory block, the controller 130 may detect the bad 820th super memory block SUPER BLOCK 820 including three bad memory blocks. The controller 130 may check whether or not the bad memory blocks included in both of the 718th and 820th super memory blocks SUPER BLOCK 718 and SUPER BLOCK 820 are located at the same respective positions.

If the bad memory blocks are located at the same respective positions, the controller 130 then searches for another bad super memory block. If not, i.e., if the bad memory blocks included in both of the 718th and 820th super memory blocks SUPER BLOCK 718 and SUPER BLOCK 820 are not located at the same respective positions then the controller 130 sets the bad 820th super memory block SUPER BLOCK 820 as a victim super memory block for a target super memory block (i.e., the bad 718th super memory block SUPER BLOCK 718) for the reused bad super memory block.

For example, as exemplified in FIG. 7, the bad memory blocks (in plane PLANE1 of die DIE0, plane PLANE1 of die DIE1, and plane PLANE1 of die DIE3) of the bad 718th super memory block SUPER BLOCK 718 have different locations than the bad memory blocks (in plane PLANE0 of die DIE0, plane PLANE0 of die DIE1, and plane PLANE0 of die DIE3) of the bad 820th super memory block SUPER BLOCK 820. Therefore, the controller 130 may set the bad 820th super memory block SUPER BLOCK 820 as a victim super memory block for a target super memory block (i.e., the bad 718th super memory block SUPER BLOCK 718) for the reused bad super memory block.

The controller 130 may generate a reused super block table 700 such that the bad memory blocks included in the target super memory block (e.g., the bad 718th super memory block SUPER BLOCK 718) are replaced with normal memory blocks included in the victim super memory block (e.g., the bad 820th super memory block SUPER BLOCK 820). The normal memory blocks of the victim super memory block (e.g., the bad 820th super memory block SUPER BLOCK 820) may have the same locations as the bad memory blocks of the target super memory block (e.g., the bad 718th super memory block SUPER BLOCK 718), respectively.

For example, the controller 130 may generate in a first row of the reused super block table 700 a zeroth reused super memory block RE SUPER BLOCK 0 to replace the bad 718th super memory block SUPER BLOCK 718, and store the block address values of the 32 memory blocks of the zeroth reused super memory block RE SUPER BLOCK 0 replacing the bad 718th super memory block SUPER BLOCK 718.

Referring to FIG. 7, in the reused super block table 700, the block address values of 32 memory blocks of the zeroth reused super memory block RE SUPER BLOCK 0 may include the block address values of the normal memory blocks included in the bad 718th super memory block SUPER BLOCK 718 (i.e., the target super memory block) and the block address values of the normal memory blocks of the bad 820th super memory block SUPER BLOCK 820 (i.e., the victim super memory block) replacing the bad memory blocks of the target super memory block.

Accordingly, the controller 130 may refer to the values of the zeroth reused super memory block RE SUPER BLOCK 0 stored in the reused super block table 700 when accessing the bad 718th super memory block SUPER BLOCK 718.

Then, in order to reuse the bad 820th super memory block SUPER BLOCK 820 as a target super memory block, the controller 130 may search for another bad super memory block as a victim super memory block which has normal memory blocks for replacing the bad memory blocks of the bad 820th super memory block SUPER BLOCK 820 as well as the normal memory blocks taken for the previous target super memory block (i.e., the bad 718th super memory block SUPER BLOCK 718) for the reused bad super memory block.

As described above, some normal memory blocks of the bad 820th super memory block SUPER BLOCK 820 are taken for the reused super memory block RE SUPER BLOCK 0, and thus the bad 820th super memory block SUPER BLOCK 820 requires normal memory blocks for the taken memory blocks as well as the bad memory blocks included therein.

To sum up, the controller 130 may search for another bad super memory block as a current victim super memory block which has normal memory blocks of the same locations as the bad memory blocks of previous and current target super memory blocks (e.g., the 718th and 820th super memory blocks SUPER BLOCK 718 and SUPER BLOCK 820).

As a result of the search for another bad super memory block, the controller 130 may not detect any bad super memory block which has normal memory blocks for replacing the bad memory blocks of the bad 820th super memory block SUPER BLOCK 820 as well as the normal memory blocks taken for the previous target super memory block (i.e., the bad 718th super memory block SUPER BLOCK 718) for the reused bad super memory block.

For example, as illustrated in FIG. 7, due to the bad memory block of the first plane PLANE1 in the zeroth die DIE0, the bad 829th super memory block SUPER BLOCK 829 does not have normal memory blocks of the same locations as the bad memory blocks of previous and current target super memory blocks (i.e., the 718th and 820th super memory blocks SUPER BLOCK 718 and SUPER BLOCK 820).

When no victim super memory block is detected among the rest of the bad super memory blocks, the controller 130 may select the current target super memory block (i.e., the bad 820th super memory block SUPER BLOCK 820) and the bad 829th super memory block SUPER BLOCK 829. Although not illustrated, there may several bad super memory blocks which do not have normal memory blocks for replacing the bad memory blocks of the current target super memory block (e.g., the bad 820th super memory block SUPER BLOCK 820) as well as the normal memory blocks taken for the previous target super memory block (e.g., the bad 718th super memory block SUPER BLOCK 718) for the reused bad super memory block. Among them, the controller 130 may arbitrarily select the bad 829th super memory block SUPER BLOCK 829.

Although combining the current target super memory block (i.e., the bad 820th super memory block SUPER BLOCK 820) and the bad 829th super memory block SUPER BLOCK 829, a normal memory block is still required for replacing the bad memory block of the first plane PLANE1 in the zeroth die DIE0 in the selected bad 829th super memory block SUPER BLOCK 829 in order to generate the first reused super memory block RE SUPER BLOCK 1.

In accordance with an embodiment of the present invention, the controller 130 may generate the first reused super memory block RE SUPER BLOCK 1 by generating reused normal memory blocks and by replacing bad memory blocks (e.g., the bad memory block of the first plane PLANE1 in the zeroth die DIE0) of the bad 829th super memory block SUPER BLOCK 829 with the generated reused memory blocks.

Figure 8:
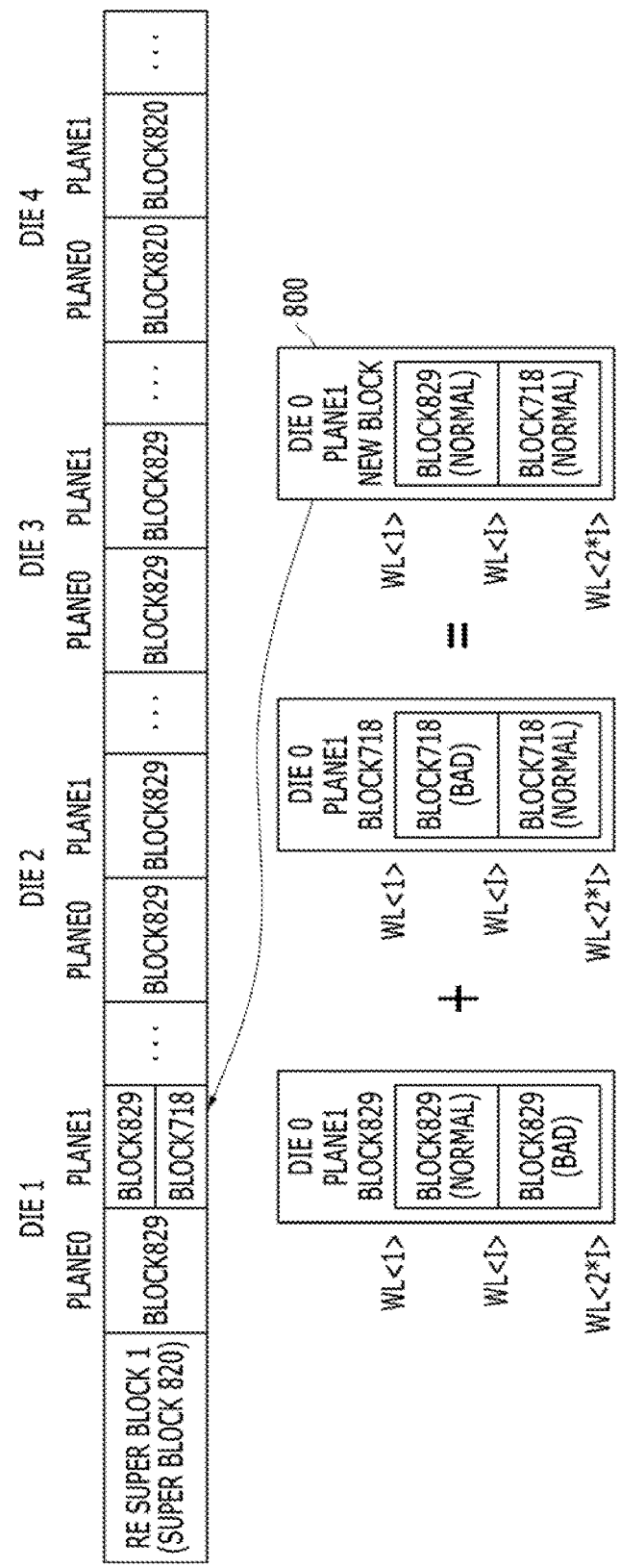
FIG. 8 is a diagram illustrating an exemplary method for generating a reused normal memory block and a reused super memory block in accordance with an embodiment of the present invention.

In the present embodiment, a bad memory block including a normal word line may be used for generating the reused normal memory blocks, with which the bad memory blocks are replaced for the generation of the reused super memory block, through a reused super block table 800 as illustrated in FIG. 8.

FIG. 8 is a diagram illustrating an exemplary method for generating a reused normal memory block and a reused super memory block in accordance with an embodiment of the present invention.

FIG. 8 exemplifies a bad memory block included in the first plane PLANE1 of the zeroth memory die DIE0 of the 718th super memory block SUPER BLOCK 718 and a bad memory block included in the first plane PLANE1 of the zeroth memory die DIE0 of the 829th super memory block SUPER BLOCK 829, which are selected to generate the reused normal memory block for the generation of the first reused super memory block RE SUPER BLOCK 1. The selection of the bad memory blocks and the generation of the reused normal memory block may be described later in detail with reference to FIG. 9.

In general, not all but only a few of the word lines included in a bad memory block may be determined as bad word lines, and remaining word lines may be determined as normal word lines. For example, when the memory block included the first plane PLANE1 of the zeroth memory die DIE0 of the 829th super memory block SUPER BLOCK 829 illustrated in FIG. 7 is determined to be a bad memory block, all word lines included in the memory block are not determined as bad word lines, but only a few of the word lines are determined as bad word lines, and the other part is normal word lines. Similarly, when the memory block included in the first plane PLANE1 of the zeroth memory die DIE0 of the 718th super memory block SUPER BLOCK 718 illustrated in FIG. 7 is determined as a bad memory block, all word lines included in the memory block are not determined as bad word lines, but only a few of the word lines are determined as bad word lines, and the other part is normal word lines.

FIG. 8 exemplifies the bad memory block included in the first plane PLANE1 of the zeroth memory die DIE0 of the 829th super memory block SUPER BLOCK 829, and having normal first to I-th word lines WL<1:I> and bad (I+1)th to 2I-th word lines WL<I+1:2I>. Furthermore, FIG. 8 exemplifies the bad memory block included in the first plane PLANE1 of the zeroth memory die DIE0 of the 718th super memory block SUPER BLOCK 718, and having bad first to I-th word lines WL<1:I> and normal (I+1)th to 2I-th word lines WL<I+1:2I>.

In order to replace the bad memory blocks (e.g., the bad memory block of the first plane PLANE 1 of the zeroth die DIE 0) of the selected bad 829th super memory block SUPER BLOCK 829 for the generation of the first reused super memory block RE SUPER BLOCK 1, the controller 130 may generate a reused normal memory block by grouping the normal word lines of the bad memory blocks (e.g., the normal first to I-th word lines WL<1:I> of the bad memory block included in the first plane PLANE1 of the zeroth memory die DIE0 of the 829th super memory block SUPER BLOCK 829, and the normal (I+1)th to 2I-th word lines WL<I+1:2I> of the bad memory block included in the first plane PLANE1 of the zeroth memory die DIE0 of the 718th super memory block SUPER BLOCK 718).

As the controller 130 replaces bad memory blocks (e.g., the bad memory block of the first plane PLANE1 in the zeroth die DIE0) of the bad 829th super memory block SUPER BLOCK 829 with the generated reused memory blocks, the controller 130 may generate in a second row of the reused super block table 700 the first reused super memory block RE SUPER BLOCK 1 to replace the bad 820th super memory block SUPER BLOCK 820, and store block address values of 32 memory blocks of the first reused super memory block RE SUPER BLOCK 1 replacing the bad 820th super memory block SUPER BLOCK 820.

For example, the value of the first reused super memory block RE SUPER BLOCK 1 stored in the second row of the reused super block table 700 illustrated in FIG. 8 may be set by replacing a total of five memory blocks included in the zeroth plane PLANE0 of the zeroth memory die DIE0, the zeroth and first planes PLALE0 and PLANE1 of the first memory die DIE1, and the zeroth and first planes PLANE0 and PLANE1 of the third memory die DIE3 with memory blocks of the super memory block SUPER BLOCK 829, and replacing the bad memory block included in the first plane PLANE1 of the zeroth memory die DIE0 of the bad 829th super memory block SUPER BLOCK 829 with the generated reused memory block NEW BLOCK.

Then, the controller 130 may refer to the value of the first reused super memory block RE SUPER BLOCK 1 stored in the second row of the reused super block table 700, when accessing the 820th super memory block SUPER BLOCK 820.

Figure 9:
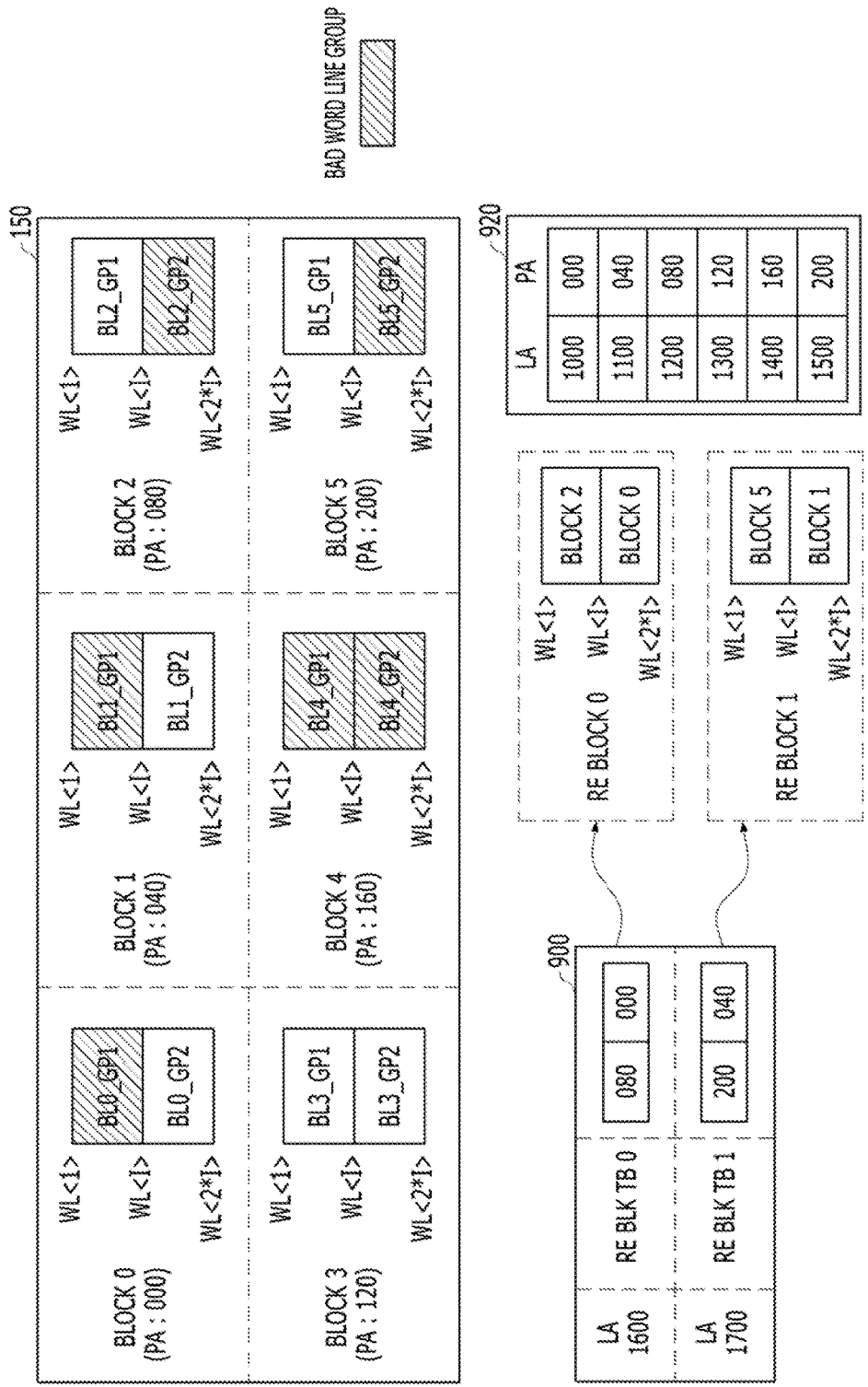
FIG. 9 is a diagram illustrating an exemplary method for generating a reused normal memory block and for mapping physical addresses and logical addresses.

FIG. 9 is a diagram illustrating an exemplary method for generating a reused normal memory block and for mapping physical addresses and logical addresses.

FIG. 9 exemplifies a method for generating a reused normal memory block and for managing a physical address of the reused normal memory block by using general bad memory blocks. The exemplified method of FIG. 9 may also be applied to the case of super memory blocks described with reference to FIGS. 7 and 8.

As exemplified in FIG. 9, each of the memory blocks BLOCK<0:5> included in the memory device 150 may include a plurality of word lines WL<1:2I>, and the word lines WL<1:2I> may be grouped into a plurality of word line groups BL<0:5>_GP<1:2>.

Although not illustrated in FIG. 9, the controller 130 may select bad memory blocks BLOCK<0:2, 4:5> including bad word lines among the memory blocks BLOCK<0:5> included in the memory device 150.

Among word line groups BL<0:2, 4:5>_GP<1:2> included in the bad memory blocks BLOCK<0:2, 4:5>, the controller 130 may generate the reused memory blocks by arranging normal word line groups BL0_GP2, BL1_GP2, BL2_GP1 and BL5_GP1 by N (i.e., by a number of word line groups to be included in a single memory block) such that each arranged N normal word line groups may not physically conflict with each other and may operate as a single normal memory block.

Further, the controller 130 may manage L number of the arranged N normal word line groups as L reused memory blocks RE BLOCK<0:1>. FIG. 9 exemplifies 2 (L=2) reused memory blocks RE BLOCK<0:1> since the controller 130 may generate 2 (=L) number of arranged 2 (=N) normal word line groups (a first word group BL2_GP1 of the second memory block BLOCK 2 and a second word group BL0_GP2 of the zeroth memory block BLOCK 0 for a zeroth reused memory block RE BLOCK 0; and a first word group BL5_GP1 of the fifth memory block BLOCK 5 and a second word line group BL1_GP2 of the first memory block BLOCK 1 for a first reused memory block RE BLOCK 1), which will be described later.

The word line groups are disposed so that they do not with each other for a single memory block. For example, when assuming a number (i.e., N) of word line groups for each of the memory blocks is 2, upper and lower word line groups GP1 and GP2, which respectively include WL<1:I> and WL<I+1:2I>, may correspond to a single memory block.

For example, when generating the reused memory block, the controller 130 may arrange a set of upper and lower word line groups, which do not conflict with each other, for a single reused memory block among the normal word line groups BL0_GP2, BL1_GP2, BL2_GP1 and BL5_GP1.

Thus, as exemplified in FIG. 9, the upper word group BL2_GP1 of the second memory block BLOCK 2 and the lower word group BL0_GP2 of the zeroth memory block BLOCK 0 may be arranged for generating the zeroth reused memory block RE BLOCK 0. Similarly, the upper word group BL5_GP1 of the fifth memory block BLOCK 5 and the lower word line group BL1_GP2 of the first memory block BLOCK 1 may be arranged for generating the first reused memory block RE BLOCK 1.

In this state, the controller 130 may generate a reused block mapping table 900. The reused block mapping table 900 may have reused memory block information RE BLK TB<0:1> respectively for the reused memory blocks (e.g., the zeroth and first reused memory blocks RE BLOCK 0 and RE BLOCK 1). Each of the reused memory block information RE BLK TB<0:1> may include several regions, each region storing physical addresses PA of the bad memory blocks BLOCK<0:2, 4:5> including normal word line groups BL0_GP2, BL1_GP2, BL2_GP1 and BL5_GP1.

In each of the reused memory block information RE BLK TB<0:1>, the regions may represent the normal word line groups arranged for a single reused memory block. As described above, the arranged normal word line groups in the regions of the respective reused memory block information RE BLK TB<0:1> may not physically conflict with each other and may operate as a single normal memory block.

As exemplified in FIG. 9, two reused memory block information RE BLK TB<0:1> stored in the reused block mapping table 900 may represent two reused memory blocks RE BLOCK<0:1>, respectively. That is, a zeroth reused memory block information RE BLK TB 0 stored in a first row of the reused block mapping table 900 may represent the zeroth reused memory block RE BLOCK 0, and a first reused memory block information RE BLK TB 1 stored in a second row may represent the first reused memory block RE BLOCK 1.

Two regions of the zeroth reused memory block information RE BLK TB 0 may sequentially store physical addresses '080' and '000' representing the second memory block BLOCK 2 and the zeroth memory block BLOCK 0. Similarly, two regions of the first reused memory block information RE BLK TB 1 may sequentially store physical addresses '200' and '040' representing the fifth memory block BLOCK 5 and the first memory block BLOCK 1.

A sequence of values (i.e., the physical addresses) stored in the regions of a single reused memory block information RE BLK TB<0:1> may correspond to an arrangement sequence of the normal word line groups of the bad memory blocks represented by the values of the regions.

As exemplified in FIG. 9, the physical addresses '080' and '000' sequentially stored in the regions of the zeroth reused memory block information RE BLK TB 0 may represent the upper word group BL2_GP1 of the second memory block BLOCK 2, which has the physical address of value '080', and the lower word group BL0_GP2 of the zeroth memory block BLOCK 0, which has the physical address of value '000', arranged for the zeroth reused memory block RE BLOCK 0. Also, the physical addresses '200' and '040' sequentially stored in the regions of the first reused memory block information RE BLK TB 1 may represent the upper word group BL5_GP1 of the fifth memory block BLOCK 5, which has the physical address of value '200', and the lower word line group BL1_GP2 of the first memory block BLOCK 1 arranged for the first reused memory block RE BLOCK 1, which has the physical address of value '040', arranged for the first reused memory block RE BLOCK 1.

Further, the controller 130 may set logical addresses of values '1600' and '1700' for the reused memory block information RE BLK TB<0:1> stored in the reused block mapping table 900, respectively.

Besides the reused block mapping table 900, the controller 130 may manage a normal block mapping table 920. In the normal block mapping table 920 may include a logical address LA and a physical address PA mapped to each other for a normal memory block.

On the other hand, as described above, the respective reused memory block information RE BLK TB<0:1>, each of which corresponds to a single logical address (e.g., the logical address of a value '1600' or '1700'), may correspond to a plurality of normal word line groups, that is, the first word group BL2_GP1 of the second memory block BLOCK 2 and the second word group BL0_GP2 of the zeroth memory block BLOCK 0 for the zeroth reused memory block RE BLOCK 0, which are represented by the physical addresses of values '080' and '000' respectively corresponding to the second memory block BLOCK 2 and the zeroth memory block BLOCK 0; and the first word group BL5_GP1 of the fifth memory block BLOCK 5 and the second word line group BL1_GP2 of the first memory block BLOCK 1 for the first reused memory block RE BLOCK 1, which are represented by the physical addresses of values '200' and '040' respectively corresponding to the fifth memory block BLOCK 5 and the first memory block BLOCK 1.

That is, in the reused block mapping table 900, a single logical address (e.g., the logical address of a value '1600' or '1700') may correspond to a plurality of physical addresses (e.g., the physical addresses of values '080' and '000' respectively corresponding to the second memory block BLOCK 2 and the zeroth memory block BLOCK 0; or the physical addresses of values '200' and '040' respectively corresponding to the fifth memory block BLOCK 5 and the first memory block BLOCK 1) for each of the reused memory block information RE BLK TB<0:1>.

Therefore, when accessing the zeroth reused memory block RE BLOCK 0, the controller 130 may refer to the logical address value of '1600' indicating the first row of the reused block mapping table 900, select the upper I word lines WL<1:I> in the second memory block BLOCK 2, and select the lower I word lines WL<I+1:2I> in the zeroth memory block BLOCK 0. Similarly, when accessing the first reused memory block RE BLOCK 1, the controller 130 may refer to the logical address value of '1700' indicating the second row of the reused block mapping table 900, select the upper I word lines WL<1:I> in the fifth memory block BLOCK 5, and select the lower I word lines WL<I+1:2I> in the first memory block BLOCK 1.

FIGS. 10 to 18 are diagrams schematically illustrating application examples of the data processing system of FIG. 1.

Figure 10:
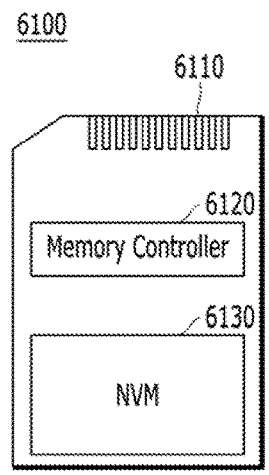
FIGS. 10 to 18 are diagrams schematically illustrating application examples of the data processing system shown in FIG. 1 in accordance with various embodiments of the present invention.

FIG. 10 is a diagram schematically illustrating another example of the data processing system including the memory system in accordance with the present embodiment. FIG. 10 schematically illustrates a memory card system to which the memory system in accordance with the present embodiment is applied.

Referring to FIG. 10, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIGS. 1 and 5, and the memory device 6130 may correspond to the memory device 150 of the memory system 110 described with reference to FIGS. 1 and 5.

Thus, the memory controller 6120 may include a RAM, a processing unit, a host interface, a memory interface and an error correction unit. The memory controller 130 may further include the elements shown in FIG. 5.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 5.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 11:
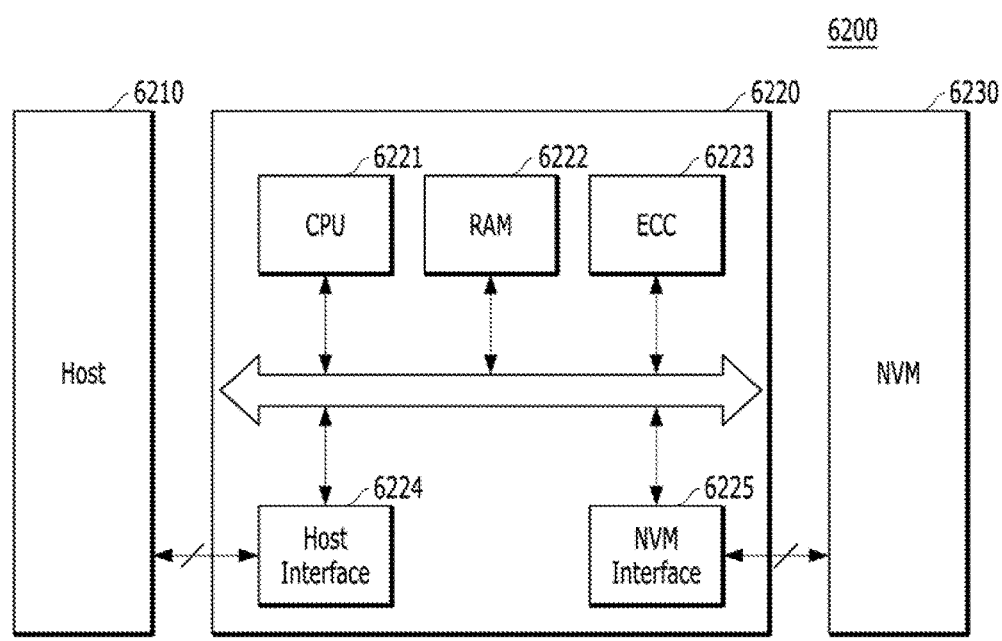

FIG. 11 is a diagram schematically illustrating another example of the data processing system including the memory system in accordance with the present embodiment.

Referring to FIG. 11, the data processing system 6200 may include a memory device 6230 having one or more nonvolatile memories and a memory controller 6220 for controlling the memory device 6230. The data processing system 6200 illustrated in FIG. 11 may serve as a storage medium such as a memory card (CF, SD, micro-SD or the like) or USB device, as described with reference to FIG. 1. The memory device 6230 may correspond to the memory device 150 in the memory system 110 illustrated in FIGS. 1 and 5, and the memory controller 6220 may correspond to the controller 130 in the memory system 110 illustrated in FIGS. 1 and 5.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with the present embodiment may be applied to wired/wireless electronic devices or particularly a mobile electronic device.

Figure 12:
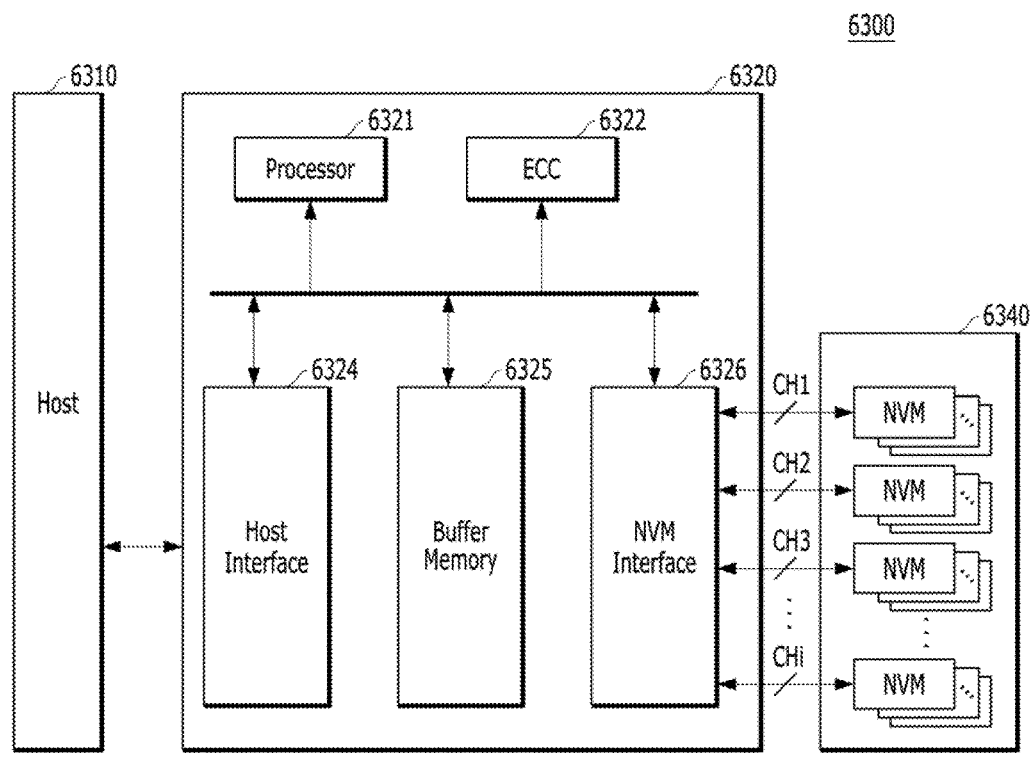

FIG. 12 is a diagram schematically illustrating another example of the data processing system including the memory system in accordance with the present embodiment. FIG. 12 schematically illustrates an SSD to which the memory system in accordance with the present embodiment is applied.

Referring to FIG. 12, the SSD 6300 may include a controller 6320 and a memory device 6340 including a plurality of nonvolatile memories. The controller 6320 may correspond to the controller 130 in the memory system 110 of FIGS. 1 and 5, and the memory device 6340 may correspond to the memory device 150 in the memory system of FIGS. 1 and 5.

More specifically, the controller 6320 may be connected to the memory device 6340 through a plurality of channels CH1 to CH1. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 11 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIGS. 1 and 5 is applied may be provided to embody a data processing system, for example, RAID (Redundant Array of Independent Disks) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 13:
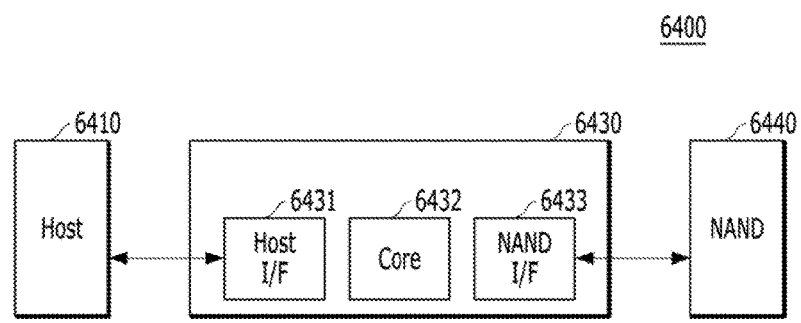

FIG. 13 is a diagram schematically illustrating another example of the data processing system including the memory system in accordance with the present embodiment. FIG. 13 schematically illustrates an embedded Multi-Media Card (eMMC) to which the memory system in accordance with the present embodiment is applied.

Referring to FIG. 13, the eMMC 6400 may include a controller 6430 and a memory device 6440 embodied by one or more NAND flash memories. The controller 6430 may correspond to the controller 130 in the memory system 110 of FIGS. 1 and 5, and the memory device 6440 may correspond to the memory device 150 in the memory system 110 of FIGS. 1 and 5.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 14 to 17 are diagrams schematically illustrating other examples of the data processing system including the memory system in accordance with the present embodiment. FIGS. 14 to 17 schematically illustrate UFS (Universal Flash Storage) systems to which the memory system in accordance with the present embodiment is applied.

Referring to FIGS. 14 to 17, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIGS. 1 and 5. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 11 to 13, and the UFS cards 6530, 6630, 6730 and 6830 may be embodied in the form of the memory card system 6100 described with reference to FIG. 10.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 14:
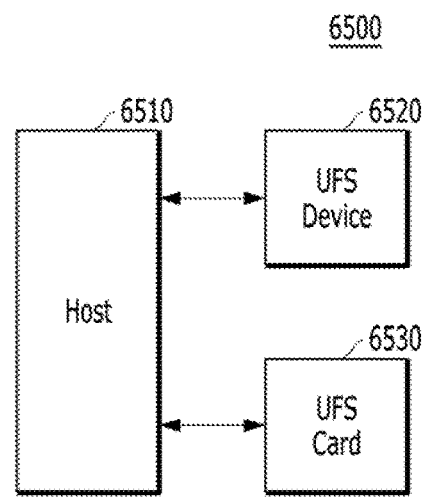

In the UFS system 6500 illustrated in FIG. 14, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In the present embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 15:
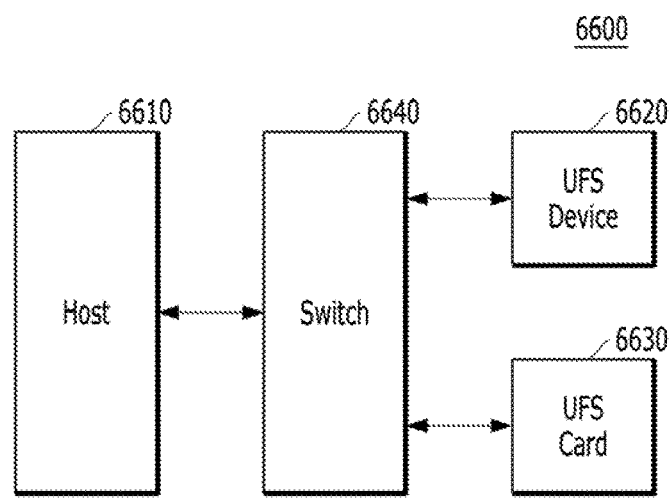

In the UFS system 6600 illustrated in FIG. 15, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 16:
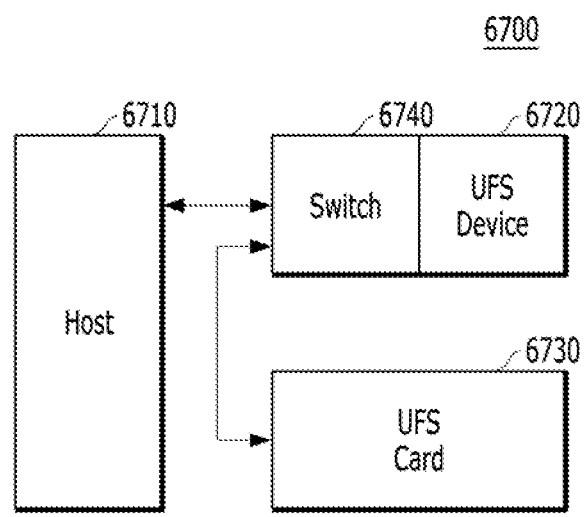

In the UFS system 6700 illustrated in FIG. 16, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 17:
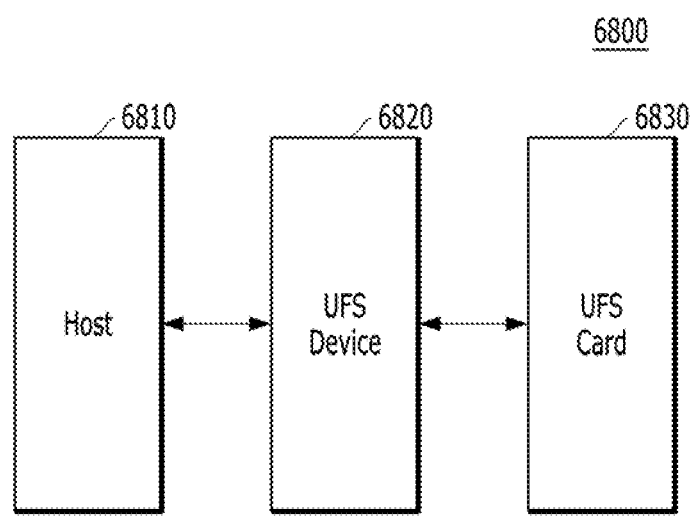

In the UFS system 6800 illustrated in FIG. 17, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. At this time, the host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 18:
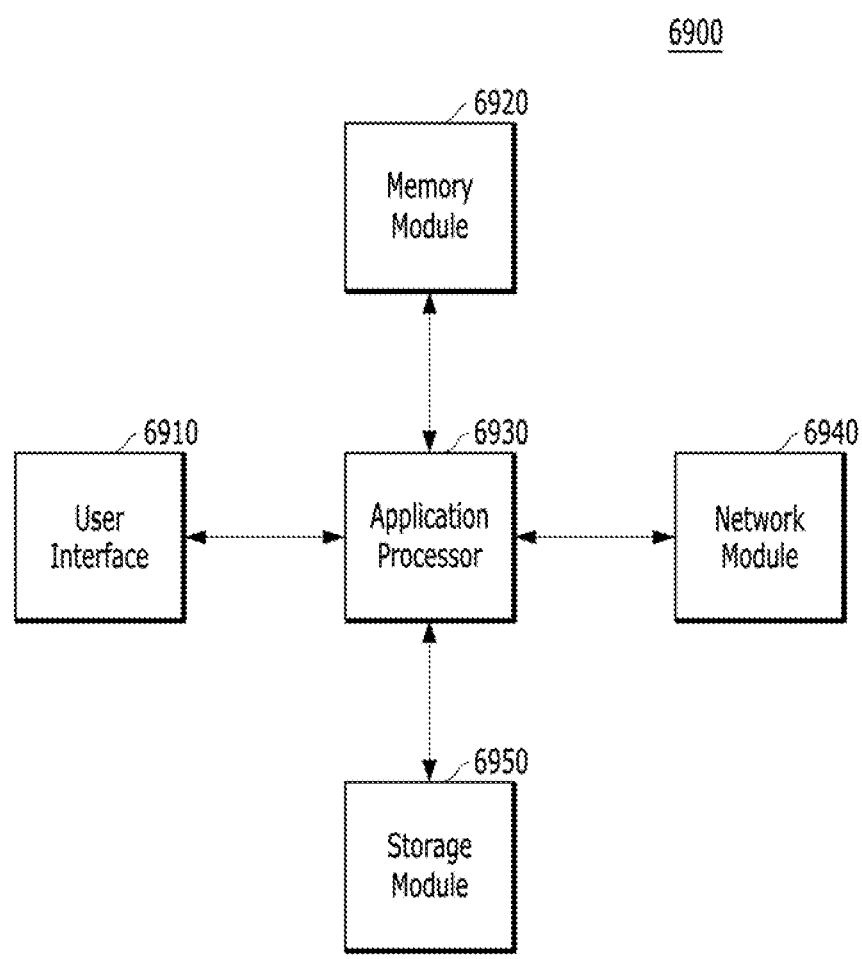

FIG. 18 is a diagram schematically illustrating another example of the data processing system including the memory system in accordance with an embodiment of the present invention. FIG. 18 is a diagram schematically illustrating a user system to which the memory system in accordance with the present embodiment is applied.

Referring to FIG. 18, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIGS. 1 and 5. Furthermore, the storage module 6950 may be embodied as an SSD, eMMC and UFS as described above with reference to FIGS. 12 to 17.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED)

display device, an active matrix OLED (AMOLED) display device, an LED, a speaker and a motor.

Furthermore, when the memory system 110 of FIGS. 1 and 5 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

In accordance with the present embodiment, the memory system may collect normal word lines excluding a preset number of word lines adjacent to bad word lines in each of bad memory blocks including the bad word lines, and use the collected normal word lines as reused memory blocks capable of performing a normal operation. Thus, the bad memory blocks including bad word lines can be reused.

Furthermore, the memory system may directly map the regenerated memory block to logical addresses, which makes it possible to increase the management efficiency of the regenerated memory blocks.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
   a memory device comprising a plurality of memory blocks each memory block having N word line groups, N being a natural number equal to or more than 2; and
   a controller suitable for:
   selecting bad memory blocks among the memory blocks;
   arranging normal word line groups of the selected bad memory blocks into one or more memory-block-word-line groups each including non-conflicting N normal word line groups; and
   managing each of the memory-block-word-line groups as a reused memory block,
   wherein the controller manages a reused block mapping table including a plurality of entries respectively corresponding to the memory-block-word-line groups,
   wherein the reused block mapping table further includes a plurality of logical addresses respectively corresponding to the entries, and
   each of the entries includes a plurality of physical address values respectively corresponding to the selected bad memory blocks having the normal word line groups included in the corresponding memory-block-word-line group.

2. The memory system of claim 1,
   wherein the controller manages a normal mapping table for mapping the physical addresses of the memory blocks to normal logical addresses, and
   wherein the values of the normal logical addresses do not overlap the values of the logical addresses corresponding to the entries.

3. The memory system of claim 2,
   wherein physical arrangement orders of the word line groups in each of the memory blocks are predetermined in the memory block, and
   wherein the physical arrangement orders of the normal word line groups in each of the memory-block-word-line groups do not overlap each other but are set to consecutive orders.

4. The memory system of claim 3, wherein the controller sorts the arrangement sequence of the physical addresses included in each entry stored in the reused block mapping table such that the N normal word line groups included in the corresponding memory-block-word-line group do not conflict with each other.

5. The memory system of claim 4,
   wherein the controller further manages the plurality of memory blocks as a plurality of super memory blocks each including two or more among the plurality of memory blocks, and
   wherein the controller further generates a reused super memory block by grouping normal memory blocks of two or more bad super memory blocks including one or more bad memory blocks among the plurality of super memory blocks.

6. The memory system of claim 5, wherein the controller generates the reused super memory block further by replacing a bad memory block included in the two or more bad super memory blocks with the reused memory block.

7. The memory system of claim 6, wherein the memory device further comprises;
   a plurality of planes corresponding to a plurality of ways which share one channel to input/output data in an interleaving manner, respectively, and each comprising the memory blocks; and
   a plurality of memory dies corresponding to a plurality of channels for inputting/outputting data in an interleaving manner, respectively, and each comprising the planes.

8. The memory system of claim 7, wherein the controller further groups an arbitrary memory block included in a first plane of any one memory die among the memory dies and an arbitrary memory block included in a second plane.

9. The memory system of claim 7, wherein the controller further groups an arbitrary memory block included in a first plane of a first memory die among the memory dies and an arbitrary memory block included in a first plane of a second memory die; or
   groups an arbitrary memory block included in a second plane of the first memory die and an arbitrary memory block included in a second plane of the second memory die.

10. The memory system of claim 7, wherein the controller groups an arbitrary memory block included in a first plane of a first memory die among the memory dies, an arbitrary memory block included in a second plane of the first memory die, an arbitrary memory block included in a first plane of a second memory die, and an arbitrary memory block included in a second plane of the second memory die.

11. An operating method of a memory system which includes a memory device having a plurality of memory blocks each having N word line groups, N being a natural number, the operating method comprising:
    selecting bad memory blocks among the memory blocks,
    arranging normal word line groups of the selected bad memory blocks into one or more memory-block-word-line groups each including non-conflicting N normal word line groups, and
    managing each of the memory-block-word-line groups as a reused memory block,
    wherein the grouping of the normal word lines comprises managing a reused block mapping table including a plurality of entries respectively corresponding to the memory-block-word-line groups, wherein the reused block mapping table further includes a plurality of logical addresses respectively corresponding to the entries, and each of the entries includes a plurality of physical address values respectively corresponding to the selected bad memory blocks having the normal word line groups included in the corresponding memory-block-word-line group.

12. The operating method of claim 11, further comprising managing a normal mapping table for mapping the physical addresses of the memory blocks to normal logical addresses, wherein the values of the normal logical addresses managed in the managing of the normal mapping table do not overlap the values of the logical addresses corresponding to the entries.

13. The operating method of claim 12, wherein physical arrangement orders of the word line groups in each of the memory blocks are predetermined in the memory block, and wherein the physical arrangement orders of the normal word line groups in each of the memory-block-word-line groups do not overlap each other but are set to consecutive orders.

14. The operating method of claim 13, wherein the grouping of the normal word lines comprises sorting the arrangement sequence of the physical addresses included in each entry stored in the reused block mapping table such that the N normal word line groups included in the corresponding memory-block-word-line group do not conflict with each other.

15. The operating method of claim 14, further comprising:

managing the plurality of memory blocks as a plurality of super memory blocks each including two or more among the plurality of memory blocks, and generating a reused super memory block by grouping normal memory blocks of two or more bad super memory blocks including one or more bad memory blocks among the plurality of super memory blocks.

16. The operating method of claim 15, the generating of the reused super memory block further comprising replacing a bad memory block included in the two or more bad super memory blocks with the reused memory block.

17. The operating method of claim 16, wherein the memory device further comprises: a plurality of planes corresponding to a plurality of ways which share one channel to input/output data in an interleaving manner, respectively, and each comprising the memory blocks; and a plurality of memory dies corresponding to a plurality of channels for inputting/outputting data in an interleaving manner, respectively, and each comprising the planes.

18. The operating method of claim 17, further comprising grouping an arbitrary memory block included in a first plane of any one memory die among the memory dies and an arbitrary memory block included in a second plane.

19. The operating method of claim 17, further comprising:

grouping an arbitrary memory block included in a first plane of a first memory die among the memory dies and an arbitrary memory block included in a first plane of a second memory die; or grouping an arbitrary memory block included in a second plane of the first memory die and an arbitrary memory block included in a second plane of the second memory die.

20. The operating method of claim 17, further comprising grouping an arbitrary memory block included in a first plane of a first memory die among the memory dies, an arbitrary memory block included in a second plane of the first memory die, an arbitrary memory block included in a first plane of a second memory die, and an arbitrary memory block included in a second plane of the second memory die.

* * * * *